(12) United States Patent
Balbinot et al.

(10) Patent No.: US 8,679,726 B2
(45) Date of Patent: Mar. 25, 2014

(54) NEGATIVE-WORKING LITHOGRAPHIC PRINTING PLATE PRECURSORS

(75) Inventors: Domenico Balbinot, Osterode (DE); Mathias Jarek, Bad Gandersheim (DE)

(73) Assignee: Eastman Kodak Company, Rochester, NY (US)

( * ) Notice: Subject to any disclaimer, the term of this patent is extended or adjusted under 35 U.S.C. 154(b) by 16 days.

(21) Appl. No.: 13/482,151

(22) Filed: May 29, 2012

(65) Prior Publication Data
US 2013/0323643 A1  Dec. 5, 2013

(51) Int. Cl.
| G03F 7/00 | (2006.01) |
| G03F 7/26 | (2006.01) |
| B41N 1/00 | (2006.01) |
| B41F 7/00 | (2006.01) |
| B41M 5/00 | (2006.01) |
| G03F 7/20 | (2006.01) |

(52) U.S. Cl.
USPC ............ 430/270.1; 430/271.1; 430/294; 430/296; 430/300; 430/302; 101/450.1; 101/453; 101/463.1

(58) Field of Classification Search
USPC ......... 430/270.1, 271.1, 302; 101/450.1, 453, 101/463.1
See application file for complete search history.

(56) References Cited

U.S. PATENT DOCUMENTS

| 4,072,527 A | 2/1978 | Fan |
| 4,072,528 A | 2/1978 | Bratt |
| 5,563,023 A | 10/1996 | Kangas et al. |
| 5,856,051 A * | 1/1999 | Yau et al. ................... 430/14 |
| 6,649,323 B2 | 11/2003 | Pappas et al. |
| 7,172,847 B2 | 2/2007 | Goto |
| 7,442,492 B2 | 10/2008 | Goto |
| 7,968,271 B2 | 6/2011 | Yamamoto et al. |
| 2006/0046185 A1 | 3/2006 | Goto |
| 2006/0216637 A1 | 9/2006 | Koizumi |
| 2007/0231739 A1 | 10/2007 | Koizumi |
| 2007/0231740 A1 | 10/2007 | Yanaka et al. |
| 2007/0287095 A1 | 12/2007 | Endo |
| 2008/0072780 A1 | 3/2008 | Sonokawa et al. |
| 2009/0087779 A1 | 4/2009 | Mori |
| 2009/0110887 A1 | 4/2009 | Sanada et al. |
| 2010/0151385 A1 | 6/2010 | Ray et al. |
| 2011/0053085 A1 | 3/2011 | Huang et al. |

FOREIGN PATENT DOCUMENTS

| EP | 0 849 090 | 6/1998 |
| EP | 0849090 A2 * | 6/1998 |
| EP | 1 865 380 | 9/2010 |
| JP | 06-043656 | 2/1994 |
| JP | 06043656 A * | 2/1994 |
| JP | 2000-147780 | 5/2000 |
| JP | 2007-245690 | 9/2007 |
| JP | 2007245690 A * | 9/2007 |
| JP | 2008-276167 | 11/2008 |
| WO | 98/13394 | 4/1998 |

* cited by examiner

Primary Examiner — Chanceity Robinson
(74) Attorney, Agent, or Firm — J. Lanny Tucker

(57) ABSTRACT

Negative-working lithographic printing plate precursor a negative-working imagable layer and an outermost water-soluble overcoat layer that is disposed directly on the negative-working imagable layer. The outermost water-soluble overcoat layer comprises: (1) one or more film-forming water-soluble polymeric binders, and (2) organic wax particles dispersed therein. The organic wax particles have an average largest dimension of at least 0.05 μm and up to and including 0.7 μm, as determined from a scanning electron micrographic of the dried outermost water-soluble overcoat layer. Useful organic wax particles include fluorinated or non-fluorinated hydrocarbon wax particles.

19 Claims, No Drawings

NEGATIVE-WORKING LITHOGRAPHIC PRINTING PLATE PRECURSORS

FIELD OF THE INVENTION

This invention relates to a negative-working lithographic printing plate precursor that comprises a unique water-soluble overcoat layer comprising hydrocarbon wax particles. This invention also relates to a method of making lithographic printing plates from the lithographic printing plate precursors of this invention using off-press processing (development).

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imagable elements useful to prepare lithographic printing plates typically comprise one or more imagable layers applied over the hydrophilic surface of a substrate. The imagable layers include one or more radiation-sensitive components that can be dispersed in a suitable binder. Alternatively, the radiation-sensitive component can also be the binder material. Following imaging, either the imaged regions or the non-imaged regions of the imagable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imagable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The imagable elements for the preparation of lithographic printing plates have been designed to be sensitive to heat or infrared radiation and can be exposed using thermal heads of more usually, infrared laser diodes that image in response to signals from a digital copy of the image in a computer a platesetter. This "computer-to-plate" technology has generally replaced the former technology where masking films were used to image the elements.

Various radiation-sensitive compositions are used in negative-working lithographic printing plate precursors as described for example in U.S. Pat. Nos. 6,309,792 (Hauck et al.), 6,893,797 (Munnelly et al.), 6,727,281 (Tao et al.), 6,899,994 (Huang et al.), and 7,429,445 (Munnelly et al.), U.S. Patent Application Publications 2002/0168494 (Nagata et al.), 2003/0118939 (West et al.), and EP Publications 1,079,276A2 (Lifka et al.) and 1,449,650A2 (Goto et al.).

After imaging, the negative-working lithographic printing plate precursors are developed (processed) to remove the non-imaged (non-exposed) regions of the imagable layer. Often, lithographic printing plate precursors are designed with a water-soluble topcoat or water-soluble oxygen-impermeable barrier layer disposed over the negative-working, photosensitive imagable layer. This topcoat is used to improve high polymerization rate during imaging by assuring higher imagable layer sensitivity.

Such lithographic printing plate precursors are generally transported after manufacture in stacks of dozens or hundreds of individual precursors. Interleaf paper is generally inserted between individual precursors to prevent scratches in the imaging surfaces. However, despite the presence of interleaf papers, the water-soluble topcoat surface can still be scratched during transportation of handling (for example, when removing the interleaf paper in an automated plate loader), leaving to a loss in sensitivity in the scratched areas.

U.S. Patent Application Publication 2010/0151385 (Ray et al.) describes negative-working lithographic printing plate precursors supplied in a stack. Each precursor has a topcoat having a dry coating weight of less than 1 g/m² so that interleaf paper can be omitted from the stack. Large particles (1-6 μm) are optional relative to the topcoat thickness or dry coating weight (<1 g/m²).

U.S. Patent Application Publication 2007/0231739 (Koizumi) describes negative-working lithographic printing plate precursors in which the protective topcoat contains organic resin fine particles and mica particles in a specified ratio. The organic resin fine particles are preferably in the range of 2-15 μm.

U.S. Patent Application Publication 2007/0231740 (Yanaka et al.) describes negative-working lithographic printing plates in which the topcoat comprises organic filler particles. Similarly, JP 2008-276167 (Yanaka et al.) describes stacks of lithographic printing plate precursors that are separated using interleaf papers. Each precursor has a topcoat comprising silica-coated organic resin particles. Both of these publications describe filler particles at preferably 1-20 μm, more preferably 2-15 μm, and optimally 3-10 μm.

EP 1,865,380 (Endo) describes similar lithographic printing plate precursors having silica-coated polymer particles in the topcoat, which particles have an average diameter of 1-30 μm or even a smaller range of 2-15 μm.

U.S. Pat. No. 5,563,023 (Kangas et al.) describes photoimagable elements having a protective overcoats can contain organic polymeric beads to provide antiblocking properties, which organic polymeric beads have a particle size range of 0.75-75 μm.

The cited publications have a common feature, namely the use of large organic particles relative to the film thickness so that certain space can be maintained when the lithographic printing plate precursors are stacked on top of each other without the insertion of interleaf paper between the precursors. The described large organic particles are ineffective for improving scratch resistance as illustrated in U.S. Patent Application Publication 2007/0231739 (noted above).

There is a need for improved lithographic printing plate precursors having free-radical based negative-working imaging chemistry that exhibit improved outer layer scratch resistance and that can be processed in processors with reduced sludge formation.

SUMMARY OF THE INVENTION

The present invention provides a negative-working lithographic printing plate precursor that comprises:

a substrate, a negative-working imagable layer disposed over the substrate, the negative-working imagable layer comprising a free radically polymerizable component, an initiator composition that is capable of generating free radicals upon exposure to imaging radiation, a radiation absorber, and a polymeric binder, and an outermost water-soluble overcoat layer that is disposed directly on the negative-working imagable layer, the outermost water-soluble overcoat layer comprising: (1) one or more film-forming water-soluble polymeric binders, and (2) hydrocarbon wax particles dispersed within the one or more film-forming water-soluble polymeric binders in an amount of at least 1.3 weight % and up to and including 60 weight %, based on the total outermost water-soluble overcoat layer weight, wherein the hydrocarbon wax particles have an average largest dimension of at least 0.05 µm and up to and including 0.7 µm, as determined from a scanning electron micrographic of the dried outermost water-soluble overcoat layer.

In addition, the present invention provides a method for preparing a lithographic printing plate, comprising:

imagewise exposing the negative-working lithographic printing plate precursor of this invention to form an imaged precursor with exposed regions and non-exposed regions in the negative-working imagable layer, and processing the imaged precursor off-press, to remove the non-exposed regions in the negative-working imagable layer to prepare a lithographic printing plate.

In some embodiments, the negative-working lithographic printing plate precursor of this invention used in this method is sensitive to infrared radiation and the imagewise exposing is carried out using a laser to provide imaging energy at a $\lambda_{max}$ of at least 700 nm and up to and including 1400 nm.

The method can also further comprise:

mounting the lithographic printing plate onto a printing press after the processing without any post processing step such as a post processing curing, water rinsing, or gumming step.

This is particularly useful when the method processing is carried out using a processing solution that both removes the non-exposed regions of the negative-working imagable layer and provides a protective coating over the processed precursor printing surface.

For example, the method of this invention can be carried out by processing using a processing solution that both removes the non-exposed regions of the negative-working imagable layer and provides a protective coating over the processed precursor printing surface, and the method further comprising mounting the lithographic printing plate onto a printing press after the processing without any post-processing step.

But in other embodiments, the processing is carried out using a processing solution having a pH of at least 3 and up to and including 12, and comprising at least one compound selected from the group consisting of a nonionic surfactant, an anionic surfactant, a hydrophilic film-forming polymer, and a neutrally-charged hydrophilic compound other than a nonionic or anionic surfactant.

In some embodiments, processing of the imaged lithographic printing plate precursor is followed by rinsing or gumming the resulting lithographic printing plate, and drying the lithographic printing plate, and optionally pre-heating the imaged precursor before the processing step.

The present invention provides a negative-working lithographic printing plate precursor that allows improved developer (processing) capacity with reduced processor sludging (or processor contamination). These advantages are achieved with a very thin outermost water-soluble overcoat layer comprising specific dry coverage of film-forming water-soluble polymeric binders and hydrocarbon wax particles that are quite small in size. The present invention provides advantages in that scratch resistance is provided with the very small hydrocarbon wax particles while processor cleanliness is improved. It was a surprise that the very small hydrocarbon wax particles would provide both of these advantages.

In particular, these advantages are achieved with the unique combination of properties wherein the water-soluble overcoat layer described herein.

DETAILED DESCRIPTION OF THE INVENTION

Definitions

As used herein to define various components of the laser-engravable compositions, formulations, and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor", "precursor", and "negative-working lithographic printing plate precursor" are meant to be references to embodiments of the present invention.

The term "support" is used herein to refer to an aluminum-containing material (web, sheet, foil, or other form) that is then treated to prepare a "substrate" that refers to the hydrophilic article upon which various layers are coated.

Unless otherwise indicated, percentages refer to percents by dry weight of a composition or layer, or % solids of a solution.

As used herein, the term "radiation absorber" refers to compounds that are sensitive to certain wavelengths of radiation and can convert photons into heat within the layer in which they are disposed.

As used herein, the term "infrared" refers to radiation having a $\lambda_{max}$ of at least 700 nm and higher. In most instances, the term "infrared" is used to refer to the "near-infrared" region of the electromagnetic spectrum that is defined herein to be at least 700 nm and up to and including 1400 nm.

The term "organic wax" refers to a chemical compound that are "plastic" or malleable near ambient temperatures and that characteristically melt at a temperature above 45° C. to provide a low viscosity liquid. An organic wax is generally insoluble in water but they are soluble in organic, nonpolar solvents. The organic wax can be synthetically prepared or naturally-occurring, and include but are not limited to animal waxes, plant waxes, and petroleum-derived waxes. Naturally occurring waxes generally comprise fatty acids and long-chain alcohols while synthetic waxes are generally long-chain hydrocarbons without functional groups, but which can also include fluorinated hydrocarbons.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Substrate

The substrate generally has a hydrophilic surface, or at least a surface that is more hydrophilic than the applied imagable layer(s) on the imaging side. The substrate comprises a support that can be composed of any material that is conventionally used to prepare imagable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 g/m$^2$ and up to and including 5 g/m$^2$ and more typically at least 3 g/m$^2$ and up to and including 4.3 g/m$^2$. Phosphoric acid anodization generally provides an oxide weight on the surface of from at least 1.5 g/m$^2$ and up to and including 5 g/m$^2$ and more typically at least 1 g/m$^2$ and up to and including 3 g/m$^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in copending and commonly assigned U.S. Ser. No. 13/221,936 (filed Aug. 31, 2011 by Hayashi) that is incorporated herein by reference.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imagable element.

Negative-Working Imagable Layers

Embodiments of this invention can be formed by suitable application of a negative-working radiation-sensitive composition as described below to a suitable substrate to form a negative-working radiation sensitive imagable layer comprising a free radically polymerizable component, a radiation absorber (such as an infrared radiation absorber), an initiator composition that is capable of generating free radicals upon exposure to imaging radiation, and a polymeric binder. There is generally only a single negative-working imagable layer comprising the radiation-sensitive composition but it is not the outermost layer in the precursor. As described in more detail below, an outermost water-soluble overcoat layer (also known as a topcoat) is disposed over the one or more negative-working imagable layers.

Many details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449, 650A1 (Goto), and EP 1,614,539A1 (Vermeersch et al.), U.S. Pat. Nos. 4,511,645 (Koike et al.), 6,027,857 (Teng), 6,309, 792 (Hauck et al.), 6,569,603 (Furukawa et al.), 6,899,994 (Huang et al.), 7,045,271 (Tao et al.), 7,049,046 (Tao et al.), 7,261,998 (Hayashi et al.), 7,279,255 (Tao et al.), 7,285,372 (Baumann et al.), 7,291,438 (Sakurai et al.), 7,326,521 (Tao et al.), 7,332,253 (Tao et al.), 7,442,486 (Baumann et al.), 7,452, 638 (Yu et al.), 7,524,614 (Tao et al.), 7,560,221 (Timpe et al.), 7,574,959 (Baumann et al.), 7,615,323 (Shrehmel et al.), and 7,672,241 (Munnelly et al.), and U.S. Patent Application Publications 2003/0064318 (Huang et al.), 2004/0265736

(Aoshima et al.), 2005/0266349 (Van Damme et al.), and 2006/0019200 (Vermeersch et al.), all of which are incorporated herein by reference. Other negative-working compositions and elements are described for example in U.S. Pat. Nos. 6,232,038 (Takasaki), 6,627,380 (Saito et al.), 6,514,657 (Sakurai et al.), 6,808,857 (Miyamoto et al.), and U.S. Patent Publication 2009/0092923 (Hayashi), all of which are incorporated herein by reference. The scope of precursors of this invention is not limited to these incorporated teachings.

The radiation-sensitive compositions and negative-working imagable layers used in such precursors can generally include one or more polymeric binders that facilitate the developability of the imaged precursors. Such polymeric binders include but are not limited to, those that are not generally crosslinkable and are usually film-forming in nature (dissolvable in coating solvent) but other polymeric binders can be present at least partially as discrete particles (not-agglomerated). Such polymeric binders can be present as discrete particles having an average particle size of at least 10 nm and up to and including 500 nm, and typically at least 100 nm and up to and including 450 nm, and that are generally distributed uniformly within that layer. The particulate polymeric binders exist at room temperature as discrete particles, for example in an aqueous dispersion. Such polymeric binders generally have a number average molecular weight ($M_n$) of at least 5,000 and typically at least 20,000 and up to and including 1,000,000, or at least 30,000 and up to and including 200,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. Nos. 6,582,882 (Pappas et al.), 6,899,994 (Huang et al.), 7,005,234 (Hoshi et al.), and 7,368,215 (Munnelly et al.), and US Patent Application Publication 2005/0003285 (Hayashi et al.), all of which are incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can have a backbone comprising multiple (at least two) urethane moieties. Such polymeric binders generally have a number average molecular weight ($M_n$) of at least 2,000 and typically at least 100,000 and up to and including 500,000, or at least 100,000 and up to and including 300,000, as determined by Gel Permeation Chromatography.

Other useful polymeric binders are particulate poly(urethane-acrylic) hybrids that are distributed (usually uniformly) throughout the imagable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

Still other useful polymeric binders can be homogenous, that is, film-forming, non-particulate, or dissolvable in the coating solvent. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.), all of which are incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxylethyl methacrylate)/acrylonitrile/N-phenyl maleimide, and random copolymers derived from N-methoxymethyl methacrylamide/-methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

The polymeric binders can be selected from any alkaline solution soluble (or dispersible) polymer having an acid value of at least 20 meq KOH/g of polymer and up to and including 400 meq KOH/g of polymer. The following described polymeric binders are useful in the manner but this is not an exhaustive list:

I. Film-forming polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. More details of such polymeric binders in U.S. Patent Application Publication 2008-0280229 (Tao et al.) that is incorporated herein by reference.

IV. Film-forming, polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. Nos. 4,874,686 (Urabe et al.), 7,729,255 (Tao et al.), 6,916,595 (Fujimaki et al.), and 7,041,416 (Wakata et al.) that are incorporated by reference, especially with respect to the general formulae (1) through (3) noted in EP 1,182,033A1.

V. Film-forming polymeric binders can have pendant 1H-tetrazole groups as described in U.S. Patent Application Publication 2009-0142695 (Baumann et al.) that is incorporated herein by reference.

VI. Still other useful polymeric binders can be film-forming or exist as discrete particles and include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033 (noted above) and U.S. Pat. Nos. 6,309,792 (Hauck et al.), 6,352,812 (Shimazu et al.), 6,569,603 (noted above), and 6,893,797 (Munnelly et al.) that are incorporated herein by reference. Also useful are the vinyl carbazole polymers described in U.S. Pat. No. 7,175,949 (Tao et al.). Other useful polymeric binders are particulate poly(urethane-acrylic) hybrids that are distributed (usually uniformly) throughout the imagable layer. Each of these hybrids has a molecular weight ($M_n$) of at least 50,000 and up to and including 500,000 and the particles have an average particle size of at least 10 nm and up to and including 10,000 nm (typically at least 30 nm and up to and including 500 nm), as determined by Gel Permeation Chromatography.

The total polymeric binders are generally present in the negative-working imagable layer an amount of at least 5 weight % and up to and including 70 weight %, or typically at least 40 weight % and up to and including 70 weight %, of the total dry layer weight.

The radiation-sensitive composition (and negative-working imagable layer) comprises one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane(meth)acrylates or urethane(meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), 6,569,603 (Furukawa), and 6,893,797 (Munnelly et al.) all of which are incorporated herein by reference. Other useful free radically polymerizable components include those described in U.S. Patent Application Publication 2009/0142695 (Baumann et al.), which radically polymerizable components include 1H-tetrazole groups, and which publication is incorporated herein by reference.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The radiation-sensitive composition (negative-working imagable layer) also includes an initiator composition that includes one or more initiators that are capable of generating free radicals sufficient to initiate polymerization of all the various free radically polymerizable components upon exposure of the composition to imaging radiation. The initiator composition is generally responsive, for example, to electromagnetic radiation in the infrared spectral regions, corresponding to the broad spectral range of at least 700 nm and up to and including 1400 nm, and typically radiation of at least 700 nm and up to and including 1250 nm. Alternatively, the initiator composition can be responsive to exposing radiation in the violet region of at least 250 nm and up to and including 450 nm and typically at least 300 nm and up to and including 450 nm.

More typically, the initiator composition includes one or more electron acceptors and one or more co-initiators that are capable of donating electrons, hydrogen atoms, or a hydrocarbon radical.

In general, suitable initiator compositions for radiation-sensitive compositions comprise initiators that include but are not limited to, aromatic sulfonylhalides, trihalogenomethylsulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. Nos. 4,565,769 (Dueber et al.) and 3,445,232 (Shirey) and can be prepared according to known methods, such as the oxidative dimerization of triarylimidazoles.

Useful initiator compositions for IR radiation-sensitive compositions include onium compounds (salts) including ammonium, sulfonium, iodonium, and phosphonium compounds, particularly in combination with cyanine infrared radiation-sensitive dyes. Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions particularly in combination with cyanine infrared radiation-sensitive dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl) phenyl]borate, 4-methoxyphenyl-4'-cyclohexylphenyliodonium tetrakis(penta-fluorophenyl)borate, 4-methylphenyl-4% dodecylphenyliodonium tetrakis(4-fluorophenyl)borate, bis(dodecylphenyl)-iodonium tetrakis (pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043,787 (Hauck et al.) is incorporated herein by reference with respect to useful initiator compositions, particularly diaryliodonium initiator compositions containing boron-containing anions.

Thus, in some embodiments, the initiator composition that is capable of generating free radicals upon exposure to imaging radiation comprises a diaryliodonium cation and a boron-containing anion, wherein the diaryliodonium cation is represented by the following Structure (I):

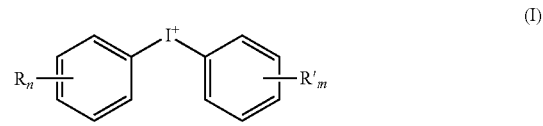

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6.

The boron-containing anion is represented by the following Structure (II):

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups.

The amount of initiator composition in the negative-working imagable layer would be readily apparent to one skilled in the art and would be dependent upon the particular radiation-sensitive composition to be used.

The negative-working imagable layers comprise a radiation-sensitive imaging composition that includes one or more radiation absorbers (such as infrared radiation absorbers) or one or more UV sensitizers. The total amount of one or more infrared radiation absorbers or UV sensitizers is at least 1 weight % and up to and including 30 weight %, or typically at least 5 weight % and up to and including 20 weight %, based on the negative-working imagable layer total solids.

In some embodiments, the radiation-sensitive composition contains a UV sensitizer when the free-radical generating compound is UV radiation sensitive (that is at least 150 nm and up to and including 475 nm), thereby facilitating photopolymerization. In other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Patent Application Publications 2006/0063101 and 2006/0234155 (both Baumann et al.), all of which publications are incorporated herein by reference.

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful sensitizers for the violet region of sensitization are the 2,4,5-triaryloxazole derivatives as described in WO 2004/074930 (Baumann et al.) that is incorporated herein by reference. These compounds can be used alone or with a co-initiator as described above. Useful 2,4,5-triaryloxazole derivatives can be represented by the Structure $G$-$(Ar_1)_3$ wherein $Ar_1$ is the same or different, substituted or unsubstituted carbocyclic aryl group having 6 to 12 carbon atoms in the ring, and G is a furan or oxazole ring, or the Structure $G$-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.) that is incorporated herein by reference.

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), 6,569,603 (noted above), 6,787, 281 (Tao et al.), 7,135,271 (Kawaushi et al.), and EP 1,182, 033A2 (noted above) all of which are incorporated herein by reference. Infrared radiation absorbing N-alkylsulfate cyanine dyes are described for example in U.S. Pat. No. 7,018, 775 (Tao) that is incorporated herein by reference. A general description of one class of suitable cyanine dyes is shown by the formula in paragraph [0026] of WO 2004/101280 (Munnelly et al.) that is incorporated herein by reference.

In addition to low molecular weight IR-absorbing dyes having IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (noted above), 6,264,920 (Achilefu et al.), 6,153,356 (noted above), and 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.) that are incorporated herein by reference.

Thus, the radiation absorber can be an infrared radiation absorber and the negative-working imagable layer is sensitive to infrared radiation.

The imagable layer can also include a poly(alkylene glycol) or an ether or ester thereof that has a molecular weight of at least 200 and up to and including 4000. The imagable layer can further include a poly(vinyl alcohol), a poly(vinyl pyrrolidone), poly(vinyl imidazole), or polyester in an amount of up to and including 20 weight % based on the total dry weight of the imagable layer.

Additional additives to the imagable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). The imagable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The imagable layer also optionally includes a phosphate(meth)acrylate having a molecular weight generally greater than 250 as described in U.S. Pat. No. 7,429,445 (Munnelly et al.) that is incorporated herein by reference.

Outermost Water-Soluble Overcoat Layer

The precursor has an outermost water-soluble overcoat layer (also sometimes known as an "oxygen impermeable topcoat" or "oxygen barrier layer") disposed over the one or more negative-working imagable layers. The water-soluble overcoat is the outermost layer of the precursor. Such water-outermost water-soluble overcoat layers comprises one or more film-forming water-soluble polymeric binders such as a poly(vinyl alcohol) having a saponification degree of at least 70%, or a saponification degree of at least 75%, or even at least 90%.

Further, one or more acid-modified poly(vinyl alcohol)s can be used as film-forming water-soluble polymeric binders in the outermost water-soluble overcoat layer. At least one modified poly(vinyl alcohol) can be modified with an acid group selected from the group consisting of carboxylic acid, sulfonic acid, sulfuric acid ester, phosphonic acid, and phosphoric acid ester groups.

Examples of such materials include but are not limited to, sulfonic acid-modified poly(vinyl alcohol), carboxylic acid-modified poly(vinyl alcohol), and quaternary ammonium salt-modified poly(vinyl alcohol), or combinations thereof. Specific commercial examples of the acid-modified poly(vinyl alcohol) include SD 1000 that is available from Kuraray, and Gohsefimer K-210, Gohseran L-3266 and Gohseran CKS-50 that are available from Nippon Gohsei.

The outermost water-soluble overcoat layer can further comprise one or more other second film-forming water-soluble polymers that are not poly(vinyl alcohol)s for example in an amount of at least 2 weight % and up to and including 38 weight %, and such second film-forming water-soluble polymers include poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, and vinyl imidazole, and vinyl acetamide.

Alternatively, the outermost water-soluble overcoat layer can be formed predominantly using one or more of film-forming water-soluble polymeric binders such as poly(vinyl pyrrolidone), poly(ethyleneimine), poly(vinyl imidazole), and random copolymers from two or more of vinyl pyrrolidone, ethyleneimine and vinyl imidazole, and mixtures of such polymers. The outermost water-soluble overcoat layer formulations can also include cationic, anionic, and non-ionic wetting agents or surfactants, flow improvers or thickeners, antifoamants, colorants, and biocides. Details about such addenda are provided in WO 99/06890 (Pappas et al.) that is incorporated by reference.

The ratio of the dry coating coverage of the outermost water-soluble overcoat layer (in $g/m^2$) to the average largest dimension of the organic wax particles (in μm), is greater than 1.1:1, and typically greater than 1.3:1.

The outermost water-soluble overcoat layer also comprises organic wax particles dispersed (generally uniformly) within the one or more film-forming water-soluble polymeric binders. These organic wax particles are generally present at a dry coverage of at least 0.001 $g/m^2$ and up to and including 0.4 $g/m^2$, or typically at a dry coverage of at least 0.006 $g/m^2$ and up to and including 0.1 $g/m^2$, or at least 0.006 $g/m^2$ and up to and including 0.03 $g/m^2$. The organic wax particles can be dispersed within the one or more film-forming water-soluble polymeric binders in an amount of at least 1.3 weight % and up to and including 60 weight %, or typically at least 2 weight % and up to and including 50 weight %, based on the total outermost water-soluble overcoat layer weight.

These hydrocarbon wax particles generally have an average largest dimension (for example, average diameter if generally spherical or an equivalent circular diameter, ECD) of at least 0.05 μm and up to and including 0.7 μm, and typically an average largest dimension of at least 0.15 μm and up to and including 0.6 μm, as determined using scanning electron micrograph (SEM) images of the dry outermost water-soluble overcoat layer.

Moreover, the hydrocarbon wax particles generally have a melting temperature of at least 100° C. and up to and including 180° C., and typically of at least 115° C. and up to and including 150° C.

Thus, these organic wax particles can comprise fluorinated or non-fluorinated hydrocarbons including but not limited to, fluorinated and non-fluorinated polyolefins, such as low density polyethylene, high density polyethylene, polypropylene, polytetrafluoroethylene, or mixtures thereof. High density and low density polyethylene wax particles and polytetrafluoroethylene are particularly useful.

Useful organic wax particles can be prepared using known procedures as described for example, in WO96/010599 (Soler). Some useful fluorinated and non-fluorinated hydrocarbon wax particles can also be purchased from a number of commercial sources such as Mitsui Chemical Inc. or Münzing Liquid Technologies GmbH.

The outermost water-soluble overcoat layer is generally present at a dry coating coverage of at least 0.1 g/m² and less than 0.9 g/m², and typically at a dry coating coverage of at least 0.15 g/m² and up to and including 0.4 g/m².

For example, the total dry coverage of the one or more film-forming water-soluble polymeric binders and the hydrocarbon wax particles in the water-soluble overcoat layer is less than or equal to 0.8 g/m², or at least 0.15 g/m² to and including 0.4 g/m².

In many embodiments, the ratio of the dry average thickness of the negative-working imagable layer to the dry average thickness of the outermost water-soluble overcoat layer is from 0.5:1 to 40:1. The dry average thickness of each layer can be determined by subsequently removing the water-soluble overcoat layer and the negative-working imagable layer in a number of specified areas and using gravimetric methods to evaluate the dry average thickness.

In some embodiments, the outermost water-soluble overcoat layer consists essentially of the one or more film-forming water-soluble polymeric binders, at least one of which is an acid-modified poly(vinyl alcohol) or a poly(vinyl alcohol) having a saponification degree of at least 70%, and polyethylene wax particles or polytetrafluoroethylene wax particles that are dispersed within the one or more film-forming water-soluble polymeric binders.

Negative-Working Lithographic Printing Plate Precursors

The negative-working radiation-sensitive composition described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. The radiation-sensitive composition can also be applied by spraying onto a suitable support. Typically, the radiation-sensitive composition is applied and dried to form a negative-working imagable layer.

Illustrative of such manufacturing methods is mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imagable layer formulations are described in the Invention Examples below. After proper drying, the coating weight of the negative-working imagable layer is generally at least 0.1 g/m² and up to and including 5 g/m² or at least 0.5 g/m² and up to and including 3.5 g/m².

Layers can also be present under the negative-working imagable layer to enhance developability or to act as a thermal insulating layer.

A suitable outermost water-soluble overcoat layer formulation can be applied to a dried negative-working imagable layer in a suitable manner, generally out of an aqueous solvent, and then dried as described below.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above) that is incorporated herein by reference.

The lithographic printing plate precursors can be stored and transported as stacks of precursors within suitable packaging and containers known in the art.

Imaging Conditions

During use, the lithographic printing plate precursor is exposed to a suitable source of exposing radiation depending upon the radiation absorber present in the radiation-sensitive composition to provide specific sensitivity that is at a wavelength of at least 150 nm and up to and including 475 nm ("UV" or "violet") or infrared of at least 700 nm and up to and including 1400 nm. In some embodiments, imagewise exposure is carried out using radiation having a $\lambda_{max}$ within the range of at least 350 nm and up to and including 450 nm with the negative-working lithographic printing plate precursor is sensitive to UV or "violet" radiation, or a $\lambda_{max}$ within the range of at least 700 nm and up to and including 1400 nm using an appropriate energy source when the negative-working lithographic printing plate precursor is sensitive to infrared radiation.

For example, imaging can be carried out using imaging or exposing radiation from a radiation-generating laser (or array of such lasers). Imaging also can be carried out using imaging radiation at multiple wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm² and up to and including 500 mJ/cm², and typically at least 50 mJ/cm² and up to and including 300 mJ/cm² depending upon the sensitivity of the imagable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 mJ/cm² and up to and including 0.5 mJ/cm², and typically at least 0.02 mJ/cm² and up to and including about 0.1 mJ/cm². It would be desirable, for example, to image the UV/visible radiation-sensitive imagable elements at a power density in the range of at least 0.5 kW/cm² and up to and including 50 kW/cm² and typically of at least 5 kW/cm² and up to and including 30 kW/cm², depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After imaging, the imaged negative-working lithographic printing plate precursors can be processed "off-press" using a suitable processing solution described herein, for example using water or a processing solution as described below. Such processing is carried out with imaged negative-working precursors for a time sufficient to remove the non-exposed regions of the imaged negative-working imagable layer and outermost water-soluble overcoat layer to reveal the hydrophilic surface of the substrate, but not long enough to remove significant amounts of the exposed regions that have been hardened. The revealed hydrophilic substrate surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable developer (described below), and followed by rinsing with water. "Dip" development involves dipping the imaged precursor in a tank or tray containing the appropriate developer for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the developer in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful developer solutions are described for example, in U.S. Pat. Nos. 7,507,526 (Miller et al.) and 7,316,894 (Miller et al.) that are incorporated herein by reference. Developer solutions can include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Useful alkaline aqueous developer solutions include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company)

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5% and up to 15% based on total developer weight. The organic solvent-containing developers can be neutral, alkaline, or slightly acidic in pH, and typically, they are alkaline in pH. Representative organic solvent-containing developers include ND-1 Developer, Developer 980, Developer 1080, 2 in 1 Developer, 955 Developer, D29 Developer (described below), and 956 Developer (all available from Eastman Kodak Company).

In some useful embodiments of the method of this invention, the processing solution used for development has a pH of at least 3 and up to and including 12 or less, and typically, the pH is at least 6 and up to and including 12 or at least 7.5 and up to and including 11.5. In addition, the processing solution can further comprise at least one compound selected from the group consisting of a nonionic surfactant, an anionic surfactant, a neutrally-charged hydrophilic compound other than a nonionic or anionic surfactant, and a hydrophilic film-forming polymer. The presence of a hydrophilic film-forming polymer (as described below) can be particularly useful in some developer solutions. Such processing solutions an also comprise one or more alkanolamines, organic solvents, organic phosphonic acids, or polycarboxylic acids or salts.

In some instances, an aqueous processing solution can be used to both develop the imaged precursor by removing the non-exposed regions of the negative-working imagable layer and also to provide a protective layer or coating over the entire imaged and developed (processed) precursor printing surface. In this aspect, the aqueous alkaline solution behaves somewhat like a gum that is capable of protecting (or "gumming") the lithographic image on the printing plate against contamination or damage (for example, from oxidation, fingerprints, dust, or scratches). Such processing solutions generally have a pH greater than 2 and up to about 11, and typically from about 6 to about 11, or from about 6 to about 10.5, as adjusted using a suitable amount of an acid or base. The aqueous processing solution generally includes an organic amine having a boiling point of less than 300° C. (and typically of at least 50° C.), a film-forming hydrophilic polymer, and optionally an anionic or nonionic surfactant. The pH of the aqueous alkaline solution can be adjusted by adding a suitable amount of a alkaline component such as alkali silicates (including metasilicates), alkali metal hydroxides (such as sodium hydroxide and potassium hydroxide), and quaternary ammonium hydroxides. Tap water can be used to make up the solution and generally provides at least 45 and up to and including 98 weight % of the solution.

After such processing, the lithographic printing plate can be mounted onto a printing press without any post-processing step, such as rinsing, gumming, or post-processing curing or UV treatment.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % and generally up to and including 50 weight %. Useful amines are mono-, di- and trialkanol amines such as monoethanolamine, diethanolamine, triethanolamine, and mono-n-propanolamine, or combinations of these compounds.

One or more film-forming water-soluble or hydrophilic compounds can be present in the processing solution in an amount of at least 0.25 weight % and up to 30 weight % and typically at least 1 weight % and up to and including 15 weight %. Examples of useful hydrophilic compounds of this type include hydrophilic polymers as well as non-polymeric hydrophilic compounds (molecular weight of less than 1,000) that are not nonionic or anionic surfactants. Useful non-polymeric and polymeric hydrophilic compounds include but are not limited to, gum arabic, pullulan, cellulose derivatives (such as hydroxymethyl celluloses, carboxymethyl-celluloses, carboxyethylcelluloses, and methyl celluloses), starch derivatives [such as (cyclo)dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, misoinosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfo, or phospho groups, or salts thereof. Useful hydrophilic compounds include gum arabic, (cyclo)dextrin, a polysaccharide, a sugar alcohol, or a homo- or copolymer having recurring units derived from (meth)acrylic acid.

The aqueous processing solution optionally includes one or more anionic, amphoteric, or nonionic surfactants (or both) in an amount of at least 0.25 weight % and up to and including 50 weight %, and typically at least 0.25 weight % and up to and including 30 weight %. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylene-alkylphenylethers, salts of sulfuric esters of polyoxyethylen-estyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Additional optional components of the aqueous alkaline solutions used in this invention include antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes.

The processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.) as incorporated herein by reference. As noted above, the imaged precursor can be immersed in the processing solution and rubbed by hand or with an apparatus. To assist in the removal of the back side coating, a brush roller or other mechanical component can be placed in contact with the back side coating during processing. Alternatively, the processing solution can be sprayed using a spray bar using a sufficient force.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

In some embodiments, the imaged lithographic printing plate precursor can be processed as described above, but before mounting onto a printing press, the resulting lithographic printing plate can be further treated by rinsing with water, an aqueous solution, or other suitable solution, gumming, or drying, or any combination of these procedures. In addition, such imaged precursors can be pre-heated prior to the processing step.

Following off-press development, the resulting lithographic printing plate can be postbaked with or without blanket or floodwise exposure to UV or visible radiation. Alternatively, a blanket UV or visible radiation exposure can be carried out, without a postbake operation.

In some embodiments, there is no post-development rinsing or gumming, but the lithographic printing plates can be used for printing without these common steps.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the imagable layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A negative-working lithographic printing plate precursor that comprises:
    a substrate,
    a negative-working imagable layer disposed over the substrate, the negative-working imagable layer comprising a free radically polymerizable component, an initiator composition that is capable of generating free radicals upon exposure to imaging radiation, a radiation absorber, and a polymeric binder, and
    an outermost water-soluble overcoat layer that is disposed directly on the negative-working imagable layer, the outermost water-soluble overcoat layer comprising: (1) one or more film-forming water-soluble polymeric binders present, and (2) organic wax particles dispersed within the one or more film-forming water-soluble polymeric binders in an amount of at least 1.3 weight % and up to and including 60 weight %, based on the total outermost water-soluble overcoat layer weight,
    wherein the organic wax particles have an average largest dimension of at least 0.05 μm and up to and including 0.7 μM, as determined from a scanning electron micrographic of the dried outermost water-soluble overcoat layer.

2. The precursor of embodiment 1, wherein the organic wax particles have a melting temperature of at least 100° C. and up to and including 180° C.

3. The precursor of embodiment 1 or 2, wherein the organic wax particles are fluorinated or non-fluorinated hydrocarbon wax particles.

4. The precursor of any of embodiments 1 to 3, wherein the organic wax particles comprise a fluorinated or non-fluorinated polyolefin.

5. The precursor of any of embodiments 1 to 4, wherein the outermost water-soluble overcoat layer is present at a dry coating coverage of at least 0.1 g/m² to and including 0.9 g/m².

6. The precursor of any of embodiments 1 to 5, wherein the ratio of the dry coating coverage of the outermost water-soluble overcoat layer (in g/m²) to the average largest dimension of the organic wax particles (in μm), is greater than 1.1.

7. The precursor of any of embodiments 1 to 6, wherein the organic wax particles are dispersed within the one or more film-forming water-soluble polymeric binders in an amount of at least 2 weight % and up to and including 50 weight %, based on the total outermost water-soluble overcoat layer weight, and the ratio of the dry coating coverage of the outermost water-soluble overcoat layer (in g/m²) to the average largest dimension of the organic wax particles (in μm), is greater than 1.3:1.

8. The precursor of any of embodiments 1 to 7, wherein the dry coverage of the organic wax particles in the outermost water-soluble overcoat layer is at least 0.001 g/m² and up to and including 0.4 g/m².

9. The precursor of any of embodiments 1 to 8, wherein the dry coverage of the organic wax particles in the outermost water-soluble overcoat layer is at least 0.006 g/m² and up to and including 0.03 g/m².

10. The precursor of any of embodiments 1 to 9, wherein the hydrocarbon wax particles have an average largest dimension of at least 0.15 μm and up to and including 0.6 μm.

11. The precursor of any of embodiments 1 to 10, wherein the one or more film-forming water-soluble polymeric binders comprise a poly(vinyl alcohol) having a saponification degree of at least 70%.

12. The precursor of any of embodiments 1 to 11, wherein the one or more film-forming water-soluble polymeric binders comprise at least one modified poly(vinyl alcohol) that is modified with an acid group selected from the group consisting of carboxylic acid, sulfonic acid, sulfuric acid ester, phosphonic acid, and phosphoric acid ester groups.

13. The precursor of any of embodiments 1 to 12, wherein the outermost water-soluble overcoat layer is present at a dry coating coverage of at least 0.15 g/m² and up to and including 0.4 g/m².

14. The precursor of any of embodiments 1 to 13, wherein the radiation absorber is an infrared radiation absorber and the negative-working imagable layer is sensitive to infrared radiation.

15. The precursor of any of embodiments 1 to 14, wherein the initiator composition that is capable of generating free radicals upon exposure to imaging radiation comprises a diaryliodonium cation and a boron-containing anion, wherein the diaryliodonium cation is represented by the following Structure (I):

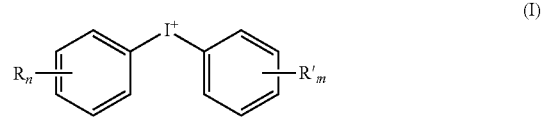

(I)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5, and
    the boron-containing anion is represented by the following Structure (II):

(II)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms.

16. The precursor of embodiment 15, wherein the boron-containing anion comprises $R^1$, $R^2$, $R^3$, and $R^4$ that represent the same substituted or unsubstituted phenyl groups and the sum of m and n is 1 to 6.

17. The precursor of any of embodiments 1 to 16, wherein the outermost water-soluble overcoat layer consists essentially of the one or more film-forming water-soluble polymeric binders, at least one of which is an acid-modified poly(vinyl alcohol) or a poly(vinyl alcohol) having a saponification degree of at least 70%, and polyethylene wax particles or polytetrafluoroethylene wax particles.

18. A method for preparing a lithographic printing plate, comprising:

imagewise exposing the negative-working lithographic printing plate precursor of any of embodiments 1 to 17 to form an imaged precursor with exposed regions and non-exposed regions in the negative-working imagable layer, and processing the imaged precursor off-press, to remove the non-exposed regions in the negative-working imagable layer to prepare a lithographic printing plate.

19. The method of embodiment 18, wherein the negative-working lithographic printing plate precursor is sensitive to infrared radiation and the imagewise exposing is carried out using a laser to provide imaging energy at a $\lambda_{max}$ of at least 700 nm and up to and including 1400 nm.

20. The method of embodiment 18 to 19 further comprising:

mounting the lithographic printing plate onto a printing press after the processing without any post-processing step.

21. The method of any of embodiments 18 to 20, comprising:

processing using a processing solution having a pH of at least 3 and up to and including 12, and comprising at least one compound selected from the group consisting of a nonionic surfactant, an anionic surfactant, a hydrophilic film-forming polymer, and a neutrally-charged hydrophilic compound other than a nonionic or anionic surfactant.

22. The method of any of embodiments 18 to 21, comprising:

processing using a processing solution that both removes the non-exposed regions of the negative-working imagable layer and provides a protective coating over the processed precursor printing surface, and comprising mounting the lithographic printing plate onto a printing press after the processing without any post-processing step.

23. The method of any of embodiments 18, 19, and 21 further comprising:

rinsing or gumming the lithographic printing plate, and drying the lithographic printing plate, and optionally pre-heating the imaged precursor before the processing step.

The following Examples are provided to illustrate the practice of this invention and are not meant to be limiting in any manner. The components and materials used in the examples were as follows:

Aerosil® W630 is an aqueous dispersion of aluminum oxide particles (140 nm average largest dimension or average particle diameter) that is available from Evonik.

Aerosil® W1836 is an aqueous dispersion of silicon dioxide particles (300 nm average largest dimension or average particle diameter) that is available from Evonik.

BLO represents γ-butyrolactone.

Byk® 307 is a polyethoxylated dimethyl polysiloxane that is available from Byk Chemie.

CD9053 is an adhesion promoter that is available from Sartomer.

CS10 PS-720 is an aqueous dispersion of polystyrene particles (10 μm average largest dimension; average particle diameter) that is available from Microbeads.

Dowanol® PM is propylene glycol methyl ether that is available from Dow Chemical.

Emulan® TO 40 is a nonionic surfactant that is available from BASF.

Hybridur® 580 is a urethane-acrylic hybrid polymer dispersion that is available from Air Products and Chemicals.

IB05 represents bis(4-t-butylphenyl)iodonium tetraphenylborate.

Klebosol™ 50R50 is an aqueous dispersion of silicon dioxide (50 nm average largest dimension or average particle diameter) available from AZ Electronic Materials.

LUBA-print VP 499/A is a PE dispersion of wax particles (composed of polyethylene; 150 nm average largest dimension or average particle diameter) that is available from Münzing Liquid Technologies GmbH.

LUBA-print VP5500 is a dispersion of wax particles (composed of polyethylene; 280 nm average largest dimension or average particle diameter) that is available from Münzing Liquid Technologies GmbH.

LUBA-print 138/E is a dispersion of wax particles (composed of polytetrafluoroethylene; 200 nm average largest dimension or average particle diameter) that is available from Münzing Liquid Technologies GmbH.

Lutensol® TO10 is an ethoxylated C13 alcohol that is available from BASF.

MEK represents methyl ethyl ketone.

Naxan® ABL is an anionic surfactant that is available from Nease Co.

Nanobyk® 3810 is an aqueous dispersion of cerium oxide (10 nm average largest dimension or average particle diameter) available from Byk Chemie.

Nanobyk® 3840 is an aqueous dispersion of zinc oxide (40 nm average largest dimension or average particle diameter) available from Byk Chemie.

Pig951 is a dispersion in propylene glycol monomethyl ether containing 9 weight % of copper phthalocyanine and 1 weight % of a poly(vinyl acetal) binder containing 39.9 mol % of vinyl alcohol recurring units, 1.2 mol % of vinyl acetate recurring units, 15.4 mol % of acetal groups from acetaldehyde, 36.1 mol % of acetal groups from butyraldehyde, and 7.4 acetal groups from 4-formylbenzoic acid.

Polymer A is a copolymer formed by random polymerization of methacrylic acid, allyl methacrylic acid ester, benzyl methacrylic acid ester, and isopropyl acrylamides that are provided at a 20/40/20/20 molar ratio and Polymer A had an acid number of 87.

PMMA particle dispersion A is an aqueous dispersion of PMMA particles (350 nm average largest dimension or average particle diameter) obtained by polymerization of methyl methacrylate according to standard literature methods.

SD1000 is a carboxylic acid modified poly(vinyl alcohol) that was obtained from Kuraray.

SDY-70 represents crosslinked polystyrene particles (6 μm average largest dimension or average particle diameter) that were obtained from Eastman Kodak Company.

IR dye A is 1,3,3-Trimethyl-2-(2-[3-[2-(1,3,3-trimethyl-1,3-dihydro-indol-2-ylidene)-ethylidene]-2-[5-(4-vinyl-benzylsulfanyl)-[1,3,4]thiadiazol-2-ylsulfanyl]-cyclohex-1-enyl]-vinyl)-3H-indolium chloride.

Sorbidex™ 200 is a saccharide syrup that is available from Cerestar.

Oligomer A is dipentaerythritol pentaacrylate that is available from Sigma Aldrich.

Invention Example 1

A negative-working imagable layer formulation was prepared according to the present invention by dissolving or dispersing 1.34 g of Hybridur® 580, 0.44 g of Polymer A, 2.94 g of Oligomer A, 0.12 g of CD9053, 1.68 g of Pig951, 0.22 g of IB05, 0.06 g of IR dye A, and 0.12 g of Byk® 307 in a mixture of 2.03 g of BLO, 7.89 g of MEK, 7.20 g of Dowanol® PM (2-methoxy propanol), and 0.25 g of water. For each lithographic printing plate precursor, this negative-working imagable layer formulation was applied to an electrochemically grained and anodized aluminium substrate that had been post-treated with poly(vinyl phosphoric acid) to provide a dry coating weight of an imagable of about 0.9 g/m$^2$.

On the dried imagable layer, a water-soluble overcoat layer was formed by applying a formulation comprising 1.90 g of SD 1000, 0.08 g of Lutensol® TO10, 0.26 g of LUBA-print VP 499/A wax dispersion, and 50 g of water and dried to provide a dry outermost water-soluble overcoat coverage of 0.2 g/m$^2$.

Invention Example 2

A negative-working lithographic printing plate precursor was prepared according to the present invention in the same manner as described in Invention Example 1, except that the dry coverage of the outermost water-soluble overcoat layer (same formulation) was increased to 0.4 g/m$^2$.

Invention Example 3

Another negative-working lithographic printing plate precursor was prepared in the same manner as described in Invention Example 1, except that a water-soluble overcoat layer formulation applied to the imagable layer comprised 1.80 g of SD1000, 0.08 g of Lutensol® TO10, 0.52 g of LUBA-print VP 499/A wax dispersion, and 50 g of water to provide a dry outermost water-soluble overcoat coverage of 0.2 g/m$^2$.

Invention Example 4

Another negative-working lithographic printing plate precursor was prepared according to the present invention in the same manner as described in Invention Example 1, except that a water-soluble overcoat layer was applied from a formulation comprising 1.60 g of SD1000, 0.08 g of Lutensol® TO10, 1.05 g of LUBA-print VP 499/A wax dispersion, and 50 g of water to provide a dry outermost water-soluble overcoat layer coverage of 0.2 g/m$^2$.

Invention Example 5

Another negative-working lithographic printing plate precursor was prepared according to the present invention in the same manner as described in Invention Example 1, except that a water-soluble overcoat layer was applied from a formulation comprising 0.99 g of SD1000, 0.09 g of Lutensol® TO10, 2.70 g of LUBA-print VP499/A wax dispersion, and 50 g of water to provide a dry outermost water-soluble overcoat layer coverage of 0.2 g/m$^2$.

Comparative Example 1

Another negative-working lithographic printing plate precursor was prepared according to the present invention in the same manner as described in Invention Example 1, except that a water-soluble overcoat layer was applied from a formulation comprising 0.09 g of Lutensol® TO10, 5.32 g of LUBA-print VP 499/A wax dispersion, and 50 g of water to provide a dry outermost water-soluble overcoat layer coverage of 0.2 g/m$^2$.

Comparative Example 2

A negative-working lithographic printing plate precursor was prepared according to the present invention in the same manner as described in Invention Example 1, except that a water-soluble overcoat layer was applied from a formulation comprising 1.98 g of SD1000, 0.08 g of Lutensol® TO10, 0.05 g of LUBA-print VP 499/A was dispersion, and 50 g of water to provide a dry outermost water-soluble overcoat layer coverage of 0.2 g/m$^2$.

Invention Example 6

A negative-working lithographic printing plate precursor was prepared according to the present invention in the same manner as described in Invention Example 1, except that a water-soluble overcoat layer was applied from a formulation comprising 1.95 g of SD1000, 0.08 g of Lutensol® TO10, 0.13 g of LUBA-print VP 499/A wax dispersion, and 50 g of water to provide a dry outermost water-soluble overcoat layer coverage of 0.2 g/m$^2$.

Comparative Example 3

A negative-working lithographic printing plate precursor was prepared in the same manner as described in Invention Example 1, except that a water-soluble overcoat layer was applied from a formulation comprising 2.01 g of SD 1000, 0.08 g of Lutensol® TO10, and 50 g of water to provide dry water-soluble overcoat coverage of 0.2 g/m$^2$. Thus, the outermost water-soluble overcoat layer contained no wax particles.

Comparative Example 4

A lithographic printing plate precursor was prepared in the same manner as described in Comparative Example 1, except that the dry coverage of the water-soluble overcoat was 1 g/m$^2$. Thus, this outermost water-soluble overcoat layer also contained no wax particles.

Invention Example 7

A negative-working lithographic printing plate precursor was prepared according to the present invention in the same manner as described in Invention Example 1, except that the dry outermost water-soluble overcoat layer coverage was 0.08 g/m$^2$.

The following evaluations were done for each of the negative-working lithographic printing plate precursors:

Evaluation of Scratch Sensitivity:

Samples of each of the negative-working lithographic printing plate precursors were subjected to a scratch test using a plynometer for 1 minute at 60 rubs with an interleaf paper and 300 g of additional weight. The precursors were placed on a Kodak® Trendsetter 800 II Quantum platesetter (830 nm) and exposed at 40 mJ/cm$^2$ using an 830 nm IR laser.

After development in a developing solution comprising 7.14 g of phenoxyethanol, 1.71 g of diethanol amine, 7.14 g of Emulan® TO40, 4.76 g of Sorbidex™ 200, 1 g of Naxan® ABL, and 67.15 g of water, the resulting imaged and developed lithographic printing plates were visually inspected for scratches in the imaged regions. Visual inspections were rated from 1 (no scratches) to 3 (many scratches).

Evaluation of Precursor Sensitivity:

Samples of each of the lithographic printing plate precursors were imaged under a silver halftone film (UGRA gray scale) using a Kodak® Trendsetter 800 II Quantum platesetter (830 nm) at 105 mJ/cm$^2$, developed in the developer described above, and the number of grayscale steps of the imagable layer remaining after development represented the sensitivity of the lithographic printing plate precursor.

Evaluation of Processor Cleanliness:

Each of the lithographic printing plate precursors were subjected to a complete loading test (cycle test) in a W860SP prototype processor from Eastman Kodak Company. The developer volume was 5 liters and the cycle volume was 75 m$^2$. The processor was visually inspected for residue on rollers and tank walls and rated from 1 (no residue) to 3 (high residue). At cycle end, the slipperiness of the entry rollers was evaluated and rated from 1 (no transportation problems) to 3 (considerable transportation problems).

The details of each Invention and Comparative Example and the resulting evaluation data are provided below in TABLE I.

TABLE I

| Example | Topcoat Dry Coverage (g/m$^2$) | Wax Particle Content (weight %) | Scratch Sensitivity | Precursor Sensitivity | Processor Cleanliness | Slipperiness |
|---|---|---|---|---|---|---|
| Invention 1 | 0.2 | 5 | 1 | 5-6 | 1 | 1 |
| Invention 2 | 0.4 | 5 | 1 | 6 | 1 | 2 |
| Invention 3 | 0.2 | 10 | 1 | 5-6 | 1 | 1 |
| Invention 4 | 0.2 | 20 | 1 | 5-6 | 1 | 1 |
| Invention 5 | 0.2 | 50 | 1 | 5 | 1 | 1 |
| Comparative 1 | 0.2 | 100 | 1 | 3 | 1 | 1 |
| Comparative 2 | 0.2 | 1 | 3 | 5-6 | 1 | 1 |
| Invention 6 | 0.2 | 2.5 | 2 | 5-6 | 1 | 1 |
| Comparative 3 | 0.2 | 0 | 3 | 5-6 | 1 | 1 |
| Comparative 4 | 1.0 | 0 | 1 | 7-8 | 3 | 3 |
| Invention 7 | 0.08 | 5 | 1 | 4 | 1 | 1 |

These results indicate that good scratch sensitivity can be achieved even with low coverage of an outermost water-soluble overcoat layer when suitable hydrocarbon wax particles are included in that layer in an amount according to the invention without having a negative effect on precursor sensitivity. Some scratch sensitivity can be achieved with higher dry coverage of the outermost water-soluble overcoat layer but the higher coverage results in undesirable inferior processor cleanliness and transport problems through the processor.

Comparative Example 5

A lithographic printing plate precursor was prepared in the same manner as described in Invention Example 1, except that LUBA-print 499/A particles were substituted with Aerosil® W630 particles. Thus, this water-soluble overcoat layer contained 5 weight % inorganic particles based on total solid content of the outermost water-soluble overcoat layer.

Comparative Example 6

A lithographic printing plate precursor was prepared in the same manner as described in Invention Example 1, except that LUBA-print 499/A particles were substituted with Aerosil® W1836 particles. Thus, this water-soluble overcoat layer contained 5 weight % inorganic particles based on total solid content of the outermost water-soluble overcoat layer.

Comparative Example 7

A lithographic printing plate precursor was prepared in the same manner as described in Invention Example 1, except that LUBA-print 499/A particles were substituted with Klebosol™ 50R50 particles. Thus, this water-soluble overcoat layer contained 5 weight % inorganic particles based on total solid content of the outermost water-soluble overcoat layer.

Comparative Example 8

A lithographic printing plate precursor was prepared in the same manner as described in Invention Example 1, except that LUBA-print 499/A particles were substituted with Nano-byk® 3810 particles. Thus, this water-soluble overcoat layer contained 5 weight % inorganic particles based on total solid content of the outermost water-soluble overcoat layer.

Comparative Example 9

A lithographic printing plate precursor was prepared in the same manner as described in Invention Example 1, except that LUBA-print 499/A particles were substituted with Nano-byk® 3840 particles. Thus, this water-soluble overcoat layer contained 5 weight % inorganic particles based on total solid content of the outermost water-soluble overcoat layer.

Comparative Example 10

A lithographic printing plate precursor was prepared in the same manner as described in Invention Example 1, except that LUBA-print 499/A particles were substituted with the PMMA particle dispersion A. Thus, this water-soluble overcoat layer contained 5 weight % organic particles based on total solid content of the outermost water-soluble overcoat layer.

Comparative Example 11

A lithographic printing plate precursor was prepared in the same manner as described in Invention Example 1, except that LUBA-print 499/A particles were substituted with the SDY-70 particles. Thus, this water-soluble overcoat layer contained 5 weight % organic particles based on total solid content of the outermost water-soluble overcoat layer.

Comparative Example 12

A lithographic printing plate precursor was prepared in the same manner as described in Invention Example 1, except that LUBA-print 499/A particles were substituted with CS10

PS-720 particles. Thus, this water-soluble overcoat layer contained 5 weight % organic particles based on total solid content of the outermost water-soluble overcoat layer.

Invention Example 8

A negative-working lithographic printing plate precursor was prepared according to the present invention in the same manner as described in Invention Example 1, except that LUBA-print 499/A particles were substituted with LUBA-print 138/E particles. Thus, this water-soluble overcoat layer contained 5 weight % organic particles based on total solid content of the outermost water-soluble overcoat layer.

Invention Example 9

A negative-working lithographic printing plate precursor was prepared according to the present invention in the same manner as described in Invention Example 1, except that LUBA-print 499/A particles were substituted with LUBA-print VP5500 particles. Thus, this water-soluble overcoat layer contained 5 weight % organic particles based on total solid content of the outermost water-soluble overcoat layer.

Invention Example 10

A negative-working lithographic printing plate precursor was prepared according to the present invention in the same manner as described in Invention Example 1, except that a water-soluble overcoat layer was applied from a formulation comprising 1.95 g of SD1000, 0.08 g of Lutensol® TO10, 0.13 g of LUBA-print VP499/A wax dispersion, and 50 g of water to provide a dry outermost water-soluble overcoat layer coverage of 0.6 g/m$^2$.

TABLE II

| Example | Topcoat Dry Coverage (g/m$^2$) | Particle Content (weight %) | Scratch Sensitivity | Precursor Sensitivity | Processor Cleanliness | Slipperiness |
| --- | --- | --- | --- | --- | --- | --- |
| Comparative 5 | 0.2 | 5 | 3 | 6 | 1 | 1 |
| Comparative 6 | 0.2 | 5 | 3 | 6 | 1 | 1 |
| Comparative 7 | 0.2 | 5 | 3 | 6 | 1 | 1 |
| Comparative 8 | 0.2 | 5 | 2-3 | 6 | 1 | 1 |
| Comparative 9 | 0.2 | 5 | 3 | 6 | 1 | 1 |
| Comparative 10 | 0.2 | 5 | 3 | 6 | 1 | 1 |
| Comparative 11 | 0.2 | 5 | 3 | 6 | 1 | 1 |
| Comparative 12 | 0.2 | 5 | 3 | 6 | 1 | 1 |
| Invention 8 | 0.2 | 5 | 1 | 5-6 | 1 | 1 |
| Invention 9 | 0.2 | 5 | 1 | 5-6 | 1 | 1 |
| Invention 10 | 0.6 | 2.5 | 1 | 7 | 1-2 | 1-2 |

The invention has been described in detail with particular reference to certain preferred embodiments thereof, but it will be understood that variations and modifications can be effected within the spirit and scope of the invention.

The invention claimed is:

1. A negative-working lithographic printing plate precursor that comprises:
    a substrate,
    a negative-working imageable layer disposed over the substrate, the negative-working imageable layer comprising a free radically polymerizable component, an initiator composition that is capable of generating free radicals upon exposure to imaging radiation, a radiation absorber, and a polymeric binder, and
    an outermost water-soluble overcoat layer that is disposed directly on the negative-working imageable layer, the outermost water-soluble overcoat layer consists essentially of one or more film-forming water-soluble polymeric binders, at least one of which is an acid-modified poly(vinyl alcohol) or a poly(vinyl alcohol) having a saponification degree of at least 70%, and organic wax particles that are polyethylene wax particles or polytetrafluoroethylene wax particles dispersed within the one or more film-forming water-soluble polymeric binders in an amount of at least 1.3 weight % and up to and including 60 weight %, based on the total outermost water-soluble overcoat layer weight,
    wherein the organic wax particles have an average largest dimension of at least 0.05 µm and up to and including 0.7 µm, as determined from a scanning electron micrographic of the outermost water-soluble overcoat layer, and
    the ratio of the dry coating coverage of the outermost water-soluble overcoat layer (in g/m$^2$) to the average largest dimension of the organic wax particles (in µm), is greater than 1.1:1.

2. The precursor of claim 1, wherein the organic wax particles have a melting temperature of at least 100° C. and up to and including 180° C.

3. The precursor of claim 1, wherein the outermost water-soluble overcoat layer is present at a dry coating coverage of at least 0.1 g/m$^2$ to and including 0.9 g/m$^2$.

4. The precursor of claim 1, wherein the organic wax particles are dispersed within the one or more film-forming water-soluble polymeric binders in an amount of at least 2 weight % and up to and including 50 weight %, based on the total outermost water-soluble overcoat layer weight, and the ratio of the dry coating coverage of the outermost water-soluble overcoat layer (in g/m$^2$) to the average largest dimension of the organic wax particles (in am), is greater than 1.3:1.

5. The precursor of claim 1, wherein the dry coverage of the organic wax particles in the outermost water-soluble overcoat layer is at least 0.001 g/m$^2$ and up to and including 0.4 g/m$^2$.

6. The precursor of claim 1, wherein the dry coverage of the organic wax particles in the outermost water-soluble overcoat layer is at least 0.006 g/m$^2$ and up to and including 0.03 g/m$^2$.

7. The precursor of claim 1, wherein the organic wax particles have an average largest dimension of at least 0.15 µm and up to and including 0.6 µm.

8. The precursor of claim 1, wherein the modified poly(vinyl alcohol) is modified with an acid group selected from the group consisting of carboxylic acid, sulfonic acid, sulfuric acid ester, phosphonic acid, and phosphoric acid ester groups.

9. The precursor of claim 1, wherein the outermost water-soluble overcoat layer is present at a dry coating coverage of at least 0.15 g/m$^2$ and up to and including 0.4 g/m$^2$.

10. The precursor of claim 1, wherein the radiation absorber is an infrared radiation absorber and the negative-working imageable layer is sensitive to infrared radiation.

11. The precursor of claim 1, wherein the initiator composition that is capable of generating free radicals upon exposure to imaging radiation comprises a diaryliodonium cation and a boron-containing anion, wherein the diaryliodonium cation is represented by the following Structure (I):

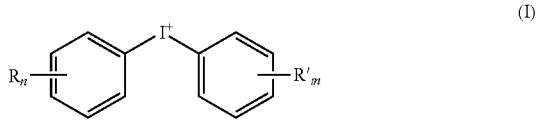

(I)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5, and the boron-containing anion is represented by the following Structure (II):

(II)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms.

12. The precursor of claim 11, wherein the boron-containing anion comprises $R^1$, $R^2$, $R^3$, and $R^4$ that represent the same substituted or unsubstituted phenyl groups and the sum of m and n is 1 to 6.

13. A method for preparing a lithographic printing plate, comprising:
imagewise exposing the negative-working lithographic printing plate precursor of claim 1 to form an imaged precursor with exposed regions and non-exposed regions in the negative-working imageable layer, and
processing the imaged precursor off-press, to remove the non-exposed regions in the negative-working imageable layer to prepare a lithographic printing plate.

14. The method of claim 13, wherein the negative-working lithographic printing plate precursor is sensitive to infrared radiation and the imagewise exposing is carried out using a laser to provide imaging energy at a $\lambda_{max}$ of at least 700 nm and up to and including 1400 nm.

15. The method of claim 13 further comprising:
mounting the lithographic printing plate onto a printing press after the processing without any post-processing step.

16. The method of claim 13, comprising:
processing using a processing solution having a pH of at least 3 and up to and including 12, and comprising at least one compound selected from the group consisting of a nonionic surfactant, an anionic surfactant, a hydrophilic film-forming polymer, and a neutrally-charged hydrophilic compound other than a nonionic or anionic surfactant.

17. The method of claim 13, comprising:
processing using a processing solution that both removes the non-exposed regions of the negative-working imageable layer and provides a protective coating over the processed precursor printing surface, and
further comprising mounting the lithographic printing plate onto a printing press after the processing without any post-processing step.

18. The method of claim 13, further comprising:
rinsing or gumming the lithographic printing plate, and drying the lithographic printing plate, and
optionally pre-heating the imaged precursor before the processing step.

19. A negative-working lithographic printing plate precursor that comprises:
a substrate,
a negative-working imageable layer disposed over the substrate, the negative-working imageable layer comprising a free radically polymerizable component, an initiator composition that is capable of generating free radicals upon exposure to imaging radiation, a radiation absorber, and a polymeric binder, and
an outermost water-soluble overcoat layer that is disposed directly on the negative-working imageable layer, the outermost water-soluble overcoat layer consists essentially of one or more film-forming water-soluble polymeric binders, at least one of which is an acid-modified poly(vinyl alcohol) or a poly(vinyl alcohol) having a saponification degree of at least 70%, and organic wax particles that are polyethylene wax particles or polytetrafluoroethylene wax particles dispersed within the one or more film-forming water-soluble polymeric binders in an amount of at least 1.3 weight % and up to and including 60 weight %, based on the total outermost water-soluble overcoat layer weight,
wherein the organic wax particles have an average largest dimension of at least 0.05 μm and up to and including 0.7 μm, as determined from a scanning electron micrographic of the dried outermost water-soluble overcoat layer, and
the dry coverage of the organic wax particles in the outermost water-soluble overcoat layer is at least 0.001 g/m² and up to and including 0.4 g/m².

* * * * *